United States Patent
Sir et al.

(10) Patent No.: US 11,699,644 B2
(45) Date of Patent: *Jul. 11, 2023

(54) ORGANIC MOLD INTERCONNECTS IN SHIELDED INTERCONNECTS FRAMES FOR INTEGRATED-CIRCUIT PACKAGES

(71) Applicant: Intel Corporation, Santa Clara, CA (US)

(72) Inventors: Jiun Hann Sir, Gelugor (MY); Eng Huat Goh, Penang (MY); Poh Boon Khoo, Perai (MY)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/529,093

(22) Filed: Nov. 17, 2021

(65) Prior Publication Data

US 2022/0077047 A1    Mar. 10, 2022

Related U.S. Application Data

(63) Continuation of application No. 16/912,653, filed on Jun. 25, 2020, now Pat. No. 11,205,613.

(30) Foreign Application Priority Data

Sep. 26, 2019 (MY) ............................ PI2019005652

(51) Int. Cl.
*H01L 23/552* (2006.01)
*H01L 23/498* (2006.01)
*H01L 21/48* (2006.01)

(52) U.S. Cl.
CPC ...... *H01L 23/49827* (2013.01); *H01L 21/486* (2013.01); *H01L 23/552* (2013.01)

(58) Field of Classification Search
CPC combination set(s) only.
See application file for complete search history.

(56) References Cited

U.S. PATENT DOCUMENTS

| | | | |
|---|---|---|---|
| 11,205,613 B2* | 12/2021 | Sir | ........................ H01L 21/486 |
| 2007/0018287 A1* | 1/2007 | Coenen | ................... H01L 23/50 |
| | | | 257/E23.079 |
| 2017/0033038 A1* | 2/2017 | Nakagawa | .............. H01L 25/00 |
| 2021/0098352 A1 | 4/2021 | Sir et al. | |
| 2021/0125951 A1* | 4/2021 | Weng | ...................... H01L 24/11 |

OTHER PUBLICATIONS

"U.S. Appl. No. 16/912,653, Notice of Allowance dated Aug. 5, 2021", 9 pgs.

* cited by examiner

*Primary Examiner* — Niki H Nguyen
(74) *Attorney, Agent, or Firm* — Schwegman Lundberg & Woessner, P.A.

(57) ABSTRACT

A molded frame interconnect includes power, ground and signal frame interconnects in a molded mass, that encloses an integrated-circuit package precursor, which is inserted into the frame, and coupled to the frame interconnects by a build-up redistribution layer.

16 Claims, 8 Drawing Sheets

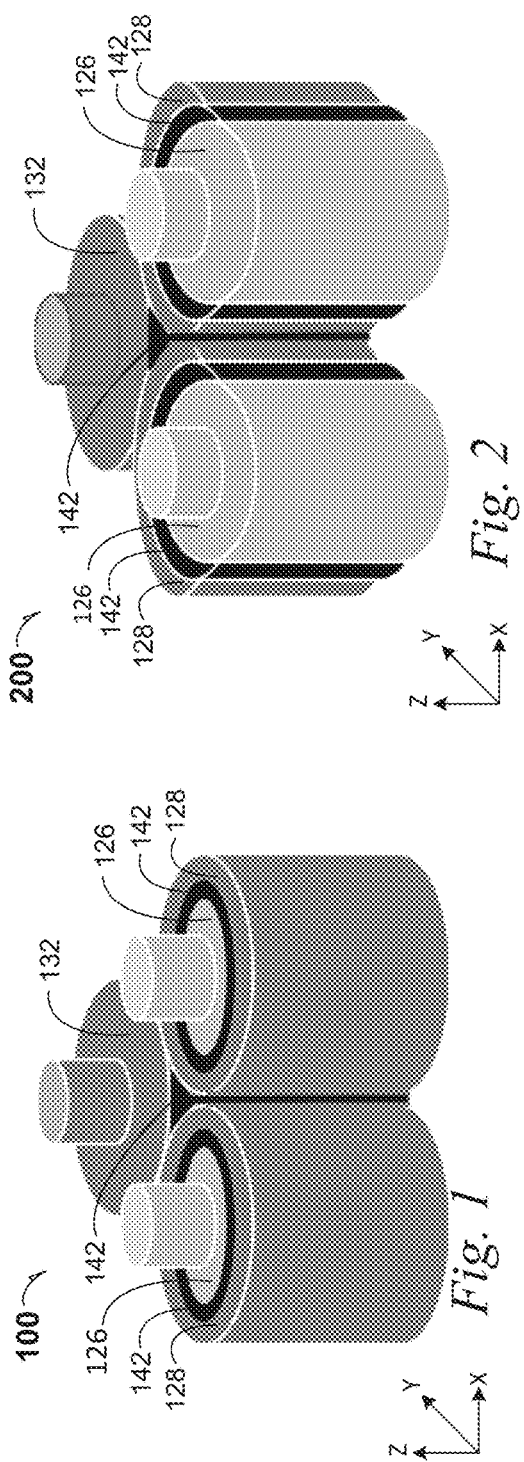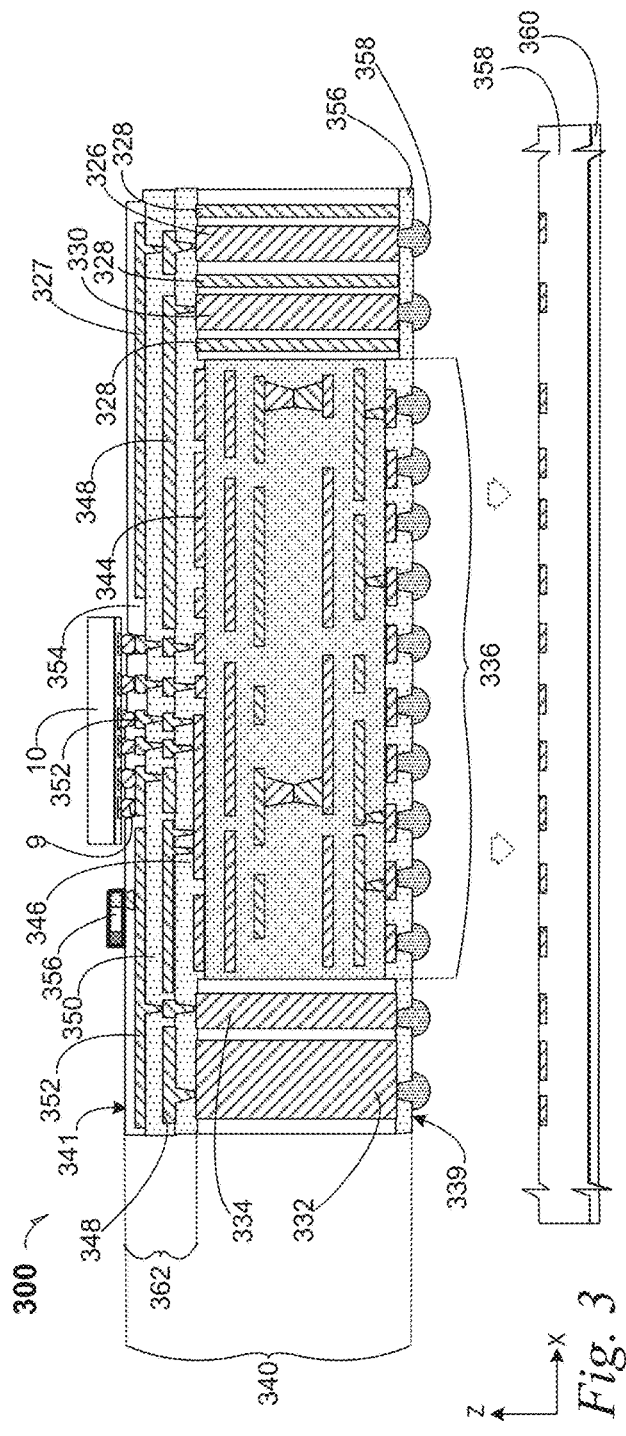

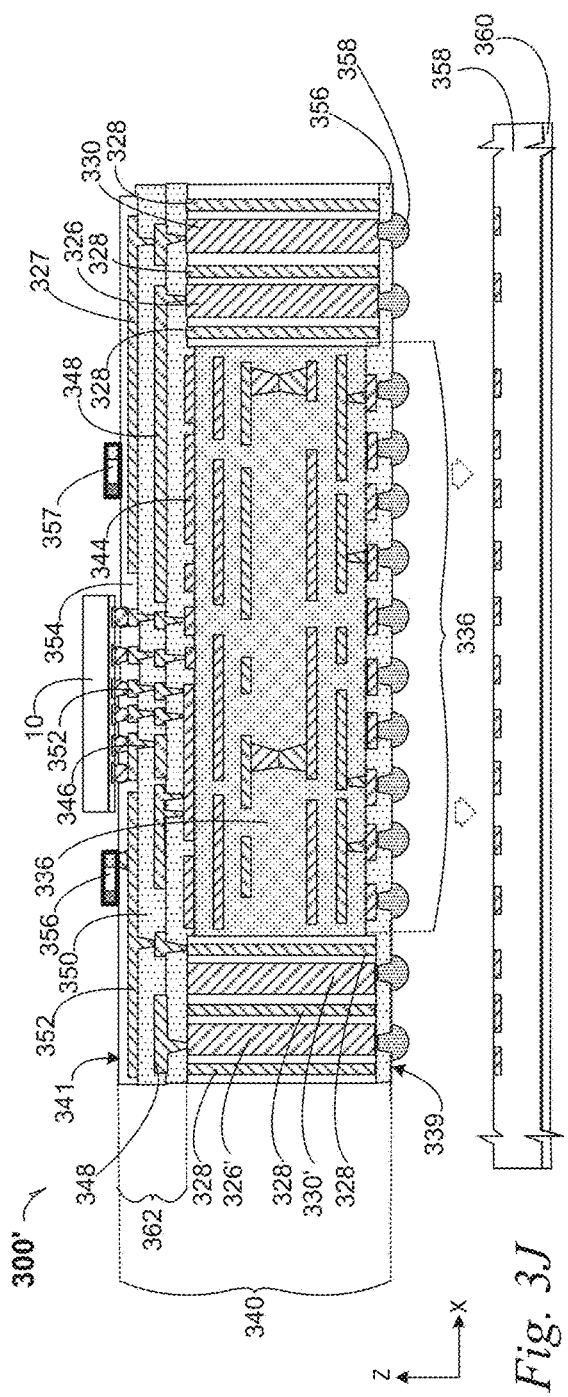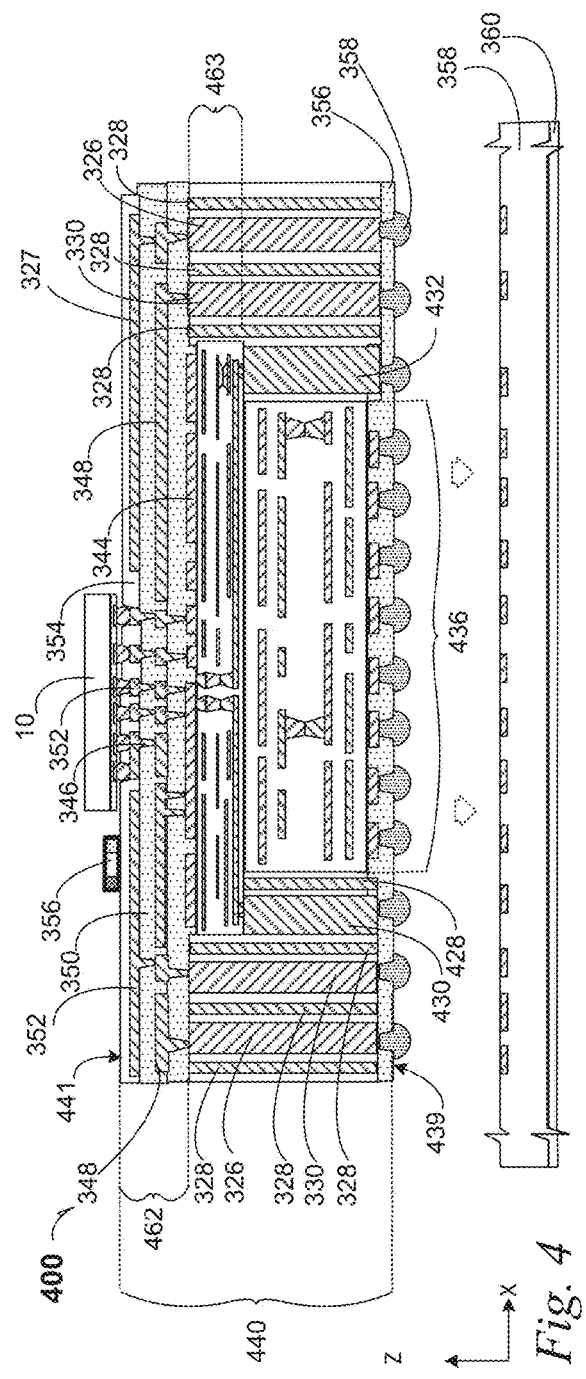

ORGANIC MOLD INTERCONNECTS IN SHIELDED INTERCONNECTS FRAMES FOR INTEGRATED-CIRCUIT PACKAGES

PRIORITY APPLICATION

This application is a continuation of U.S. application Ser. No. 16/912,653, filed Jun. 25, 2020, which claims the benefit of priority to Malaysian Application Serial Number PI2019005652, filed Sep. 26, 2019, all of which are incorporated herein by reference in their entirety.

FIELD

This disclosure relates to shielded power and input/output delivery for integrated-circuit device packages.

BACKGROUND

Integration of multiple integrated-circuit chips within a package, has power-delivery and signal-integrity issues as well as thermal stability issues as miniaturization of such packages is pursued.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1 is a perspective elevation of a group of three frame interconnects, including two shielded frame interconnects, and one unshielded frame interconnect;

FIG. 2 is a cut-away perspective elevation of the group of three frame interconnects depicted in FIG. 1 according to an embodiment;

FIG. 3 is a cross-sectional elevation of an integrated-circuit package that has been assembled according to several embodiments;

FIGS. 3A through 3J represent fabrication of organic mold interconnects in shielded interconnect frames for assembly to integrated circuit dice, and assembly into to an integrated-circuit package according to several embodiments.

FIG. 3' is a cross-sectional elevation of an integrated-circuit package similar to the IC package depicted in FIG. 3, and from a different Y-longitudinal cross section according to several embodiments;

FIG. 4 is a cross-section elevation of an integrated-circuit package according to an embodiment;

DETAILED DESCRIPTION

Figure 3A:
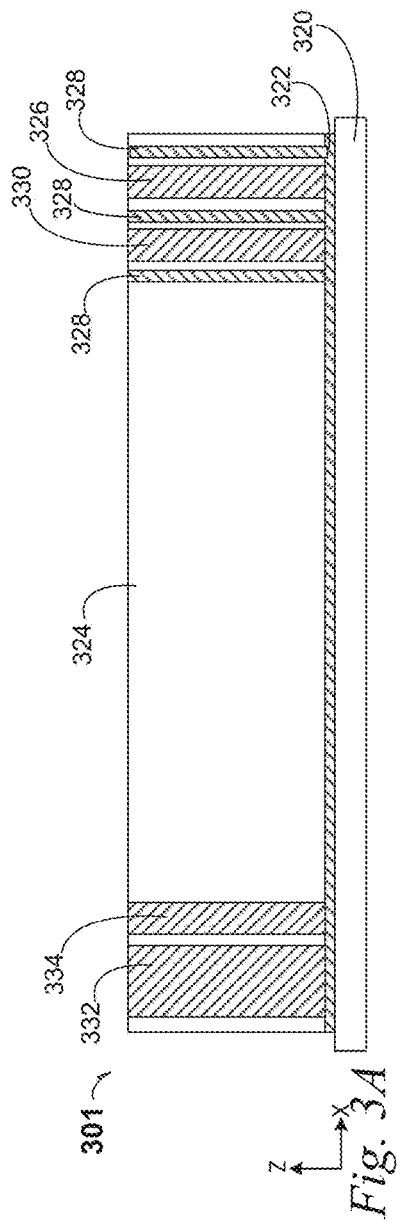

Integrated-circuit die package includes molded frame land-side to near die-side interconnects, that provide shielded power and input/output signal delivery to integrated-circuit dice on the die side of the integrated-circuit package. The molded-frame interconnects provide physical rigidity and warping stability to the integrated-circuit package.

FIG. 1 is a perspective elevation of a group of three frame interconnects, including two shielded frame interconnects, and one unshielded frame interconnect. A shielded input/output (I/O) frame interconnect 126 is contacted by an organic molding mass 142, which is shielded by a source (Vss) frame interconnect 128. The I/O frame interconnect 126 and the source frame interconnect 128, form an annulus structure, which is filled by the organic molding mass 142.

Similarly, a shielded power frame interconnect 130 is also contacted by the organic molding mass 142, which is shielded by a source (Vss) frame interconnect 128. The power frame interconnect 130 and the source frame interconnect 128, form an annulus structure, which is filled by the organic molding mass 142.

In an embodiment, an unshielded frame interconnect 132, forms a solid right cylinder, which can be used, either as an unshielded power frame interconnect 132 or as an unshielded source interconnect. As illustrated, the several frame interconnects are assembled in close-packed configuration, where any two touching frame interconnects, each touch a third frame interconnect.

FIG. 2 is a cut-away perspective elevation of the group of three frame interconnects depicted in FIG. 1 according to an embodiment. As illustrated, the organic molding mass 142 also extends at the triple juncture of the three frame interconnects with and without shielding.

Assembly of the molded frame interconnects in integrated-circuit package substrates is further described and illustrated.

FIG. 3 is a cross-sectional elevation of an integrated-circuit package 300 that has been assembled according to several embodiments. An integrated-circuit (IC) package substrate 340 includes three principal assemblies. Firstly, frame interconnects 326, 328, 330, 332 and 334 in this cross-section view, form a top-to-bottom interconnect frame (when viewed in X-Y plan view). Secondly, an IC package precursor 336 is inserted within the several frame interconnects an thirdly, a redistribution layer (RDL) 362 is assembled to the frame interconnects and the IC package precursor 336. During assembly, the RDL 362 ties and couples the several frame interconnects to the IC package precursor 336, to make a useful IC package substrate 340 according to several embodiments. Consequently, an IC package die side 341 and an IC package land side 339 define respective lower and upper regions of the IC package substrate 340.

As a result of assembling the frame interconnects with the IC package precursor 336 and the RDL 362, power (Vcc) can be shunted around the IC package precursor 336, both by, e.g. a shielded power frame interconnect 330 and by an unshielded power frame interconnect 332. As illustrated, metallizations in the RDL 362, items 348 (two occurrences) may be power planes 348 that can deliver power from the power interconnects 330 and 332, to an integrated-circuit die 10 on the die side 341, without requiring passage through the IC package precursor 336. Similarly with respect to achieving grounding (Vss) shunting interconnects, the shielding Vss interconnects 328, shield both power and/O interconnects where useful, and the unshielded Vss interconnect 334 achieves shunted grounding routes where useful.

In an embodiment, the die side 341 provides a die-footprint array for, e.g. microbumps, one microbump of which is indicated by reference number 9, between the IC die 10 and the solder-resist layer 354. In an embodiment, a die-side decoupling capacitor 356 can be coupled to a ground plane 352, and as illustrated, the ground plane 352 contacts the unshielded ground frame interconnect 334. Similarly, shielded signal (I/O) frame interconnects 326 can deliver input/output (I/O) signals to a signal trace 327 within the RDL 362, without requiring passage through the IC package precursor 336.

FIGS. 3A through 3K represent fabrication of organic mold interconnects in shielded interconnect frames for assembly to integrated circuit dice, and assembly into to an integrated-circuit package according to several embodiments. Items 3I and 3J are omitted.

At FIG. 3A, an assembly 301 is formed upon a carrier 320 that is provided to accept a metallic film 322, such as an electronics-grade copper (Cu) material 322. A dry-film resist (DFR) 324 is patterned to open frame interconnect corridors to be filled into the patterning of the DFR 324. In an embodiment, electroplating of several frame interconnects, is accomplished through the DFR 324, including shielded input/output (I/O) frame interconnects 326, shielded by a source (Vss) frame interconnect 328 that forms an annulus with the I/O frame interconnect 326. Further in an embodiment, a power frame interconnect 330 is also plated onto the metallic foil 322 through the patterned DFR 324, and shielded by a source (Vss) 328 that forms an annulus with the power frame interconnect 330. In an embodiment, two shields 328 touch between two frame interconnects, e.g. the I/O frame interconnect 326 and the power frame interconnect 330.

In an embodiment as depicted in the selected Y-longitudinal cross section as seen in FIG. 3A, an unshielded power (Vcc) frame interconnect 332 has also been electroplated onto the metallic foil 322, as well as an unshielded source (Vss) frame interconnect 334. A different Y-longitudinal cross-section elevation of the assembly 301 after further processing, is described with respect to FIG. 3', after presentation of FIG. 3H.

Figure 3B:
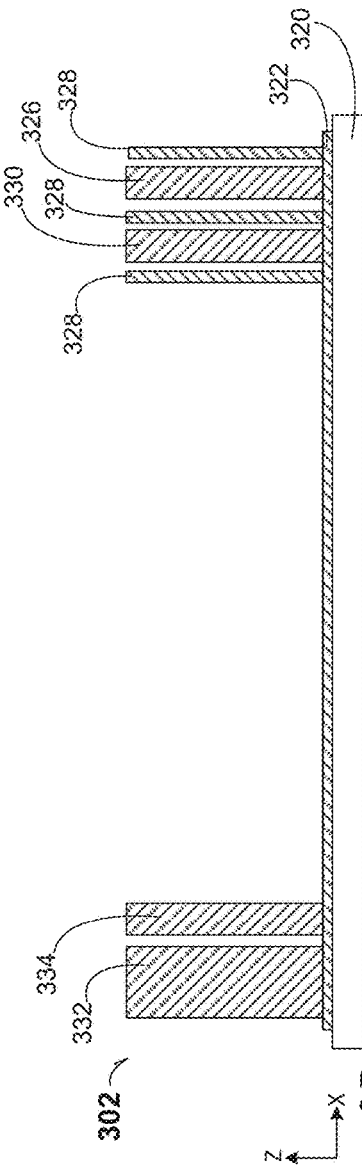

FIG. 3B is a cross-section elevation of the assembly 301 depicted in FIG. 3A after further processing according to an embodiment. The assembly 302 has been processed by removing the DFR 324 depicted in FIG. 1A, by a conventional DFR stripping technique.

Figure 3C:
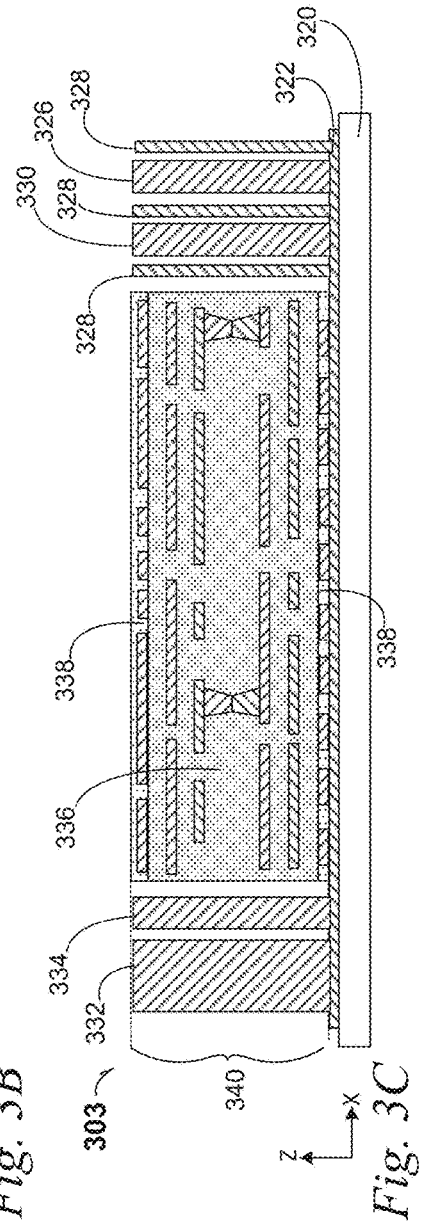

FIG. 3C is a cross-section elevation of the assembly 302 depicted in FIG. 3B after further processing according to an embodiment. The assembly 303 has been processed by inserting a package substrate precursor 336 onto the metallic film 322, between the several frame interconnects. The package substrate precursor 336 includes several traces, bond pads and vias in an organic dielectric assembly of interlayer dielectric (ILD) materials. The package substrate precursor 336 includes sacrificial protective layers 338 that cover upper and lower-Z surfaces. As assembled, an organic mold interconnect hybrid package 340 has preliminary X-Y-Z dimensions that may expand during further assembly.

Figure 3D:
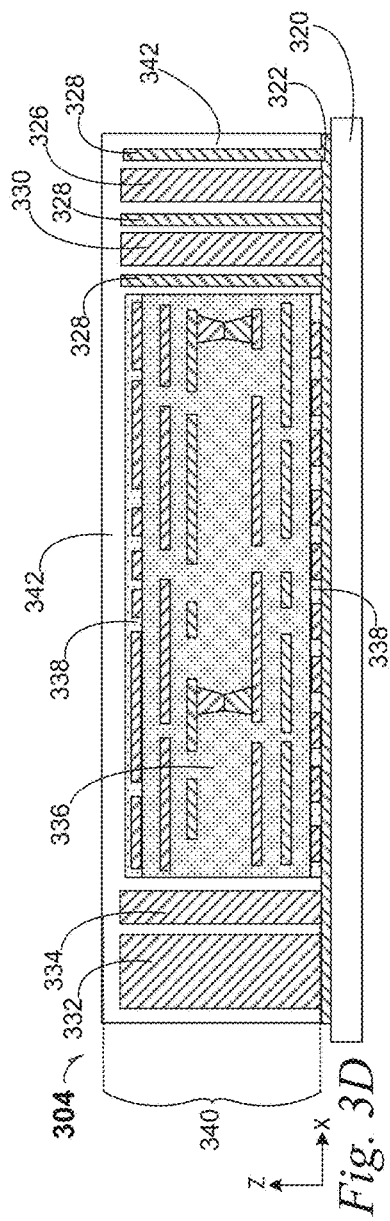

FIG. 3D is a cross-section elevation of the assembly 303 depicted in FIG. 3C after further processing according to an embodiment. The assembly 304 has been processed by filling an organic molding mass 342 into the interstices between frame interconnects 326, 328, 330, 332 and 334, as well as into the interstices between frame interconnects 334 and 328 and the package substrate precursor 336. In an embodiment, the material of the organic molding mass 342 has dielectric and structural qualities after flow and cure, to electrically and physically protect the several structures it contacts. In an embodiment, where the organic molding mass 342 fits into interstices between two structures, it may have a film form factor, and it may be referred at such locations as a dielectric film 342.

Figure 3E:
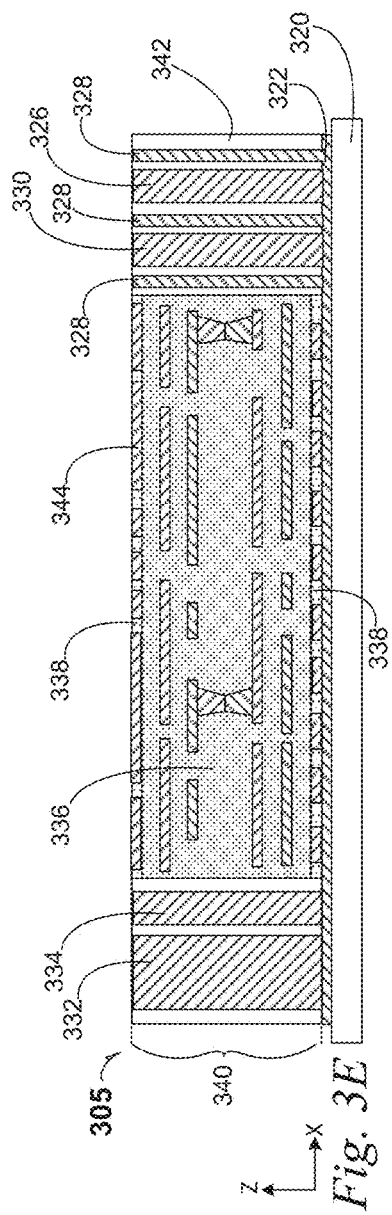

FIG. 3E is a cross-section elevation of the assembly 304 depicted in FIG. 3D after further processing according to an embodiment. The assembly 305 has been processed by back-grinding the assembly 304 at the upper-Z surface, to achieve the assembly 305, where the frame interconnects, the organic molding mass 342, and the upper sacrificial layer 338 has been height reduced according to an embodiment. Consequently, upper metallization 344 in the package substrate precursor 336 is exposed for further processing.

Figure 3F:
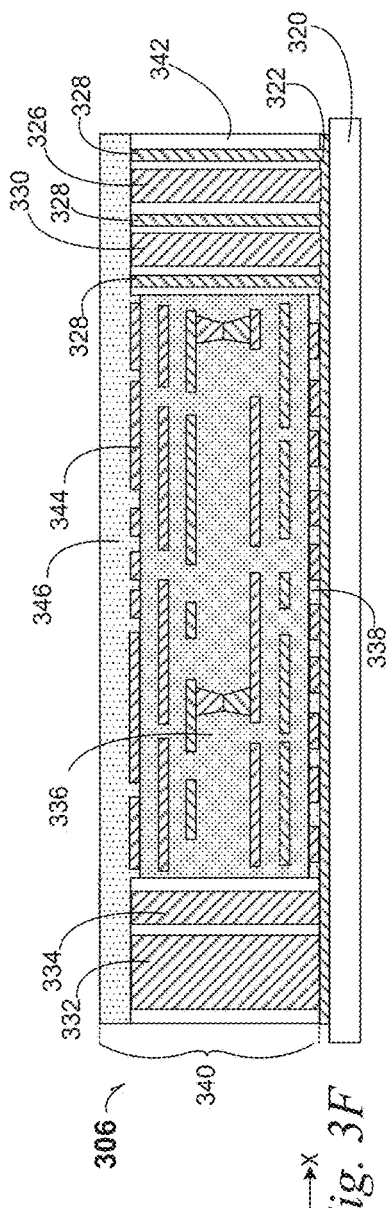

FIG. 3F is a cross-section elevation of the assembly 305 depicted in FIG. 3D after further processing according to an embodiment. The assembly 306 has been processed by depositing a build-up film 346 for patterning and allowing interconnects such as traces on the surface and contacts to be plated. After back-grinding as depicted in FIG. 3E, the sacrificial protective layer 338 on the upper surface is removed, followed by deposition of the first build-up film 346.

Figure 3G:
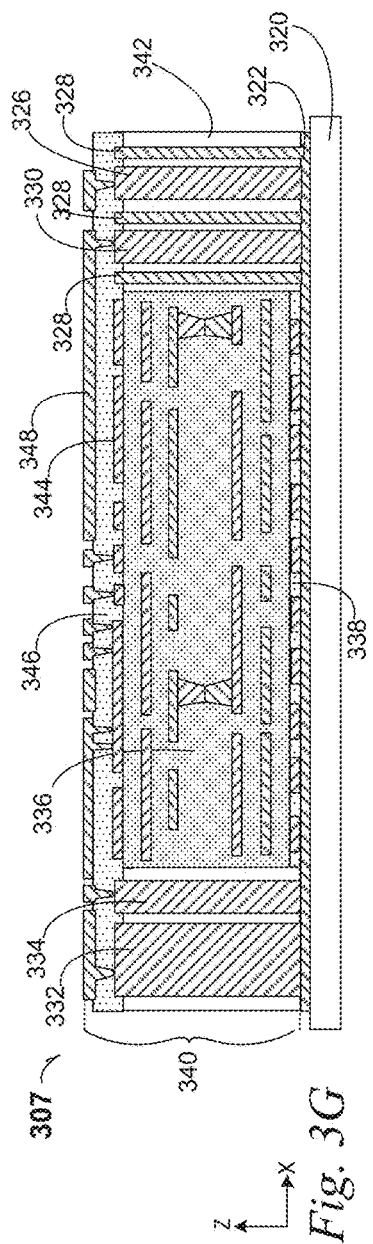

FIG. 3G is a cross-section elevation of the assembly 306 depicted in FIG. 3F after further processing according to an embodiment. The assembly 307 has been processed by depositing a first metallization 348 on the patterned first build-up film 346. The first metallization 348 includes traces and vias, as well as power and ground planes.

Figure 3H:
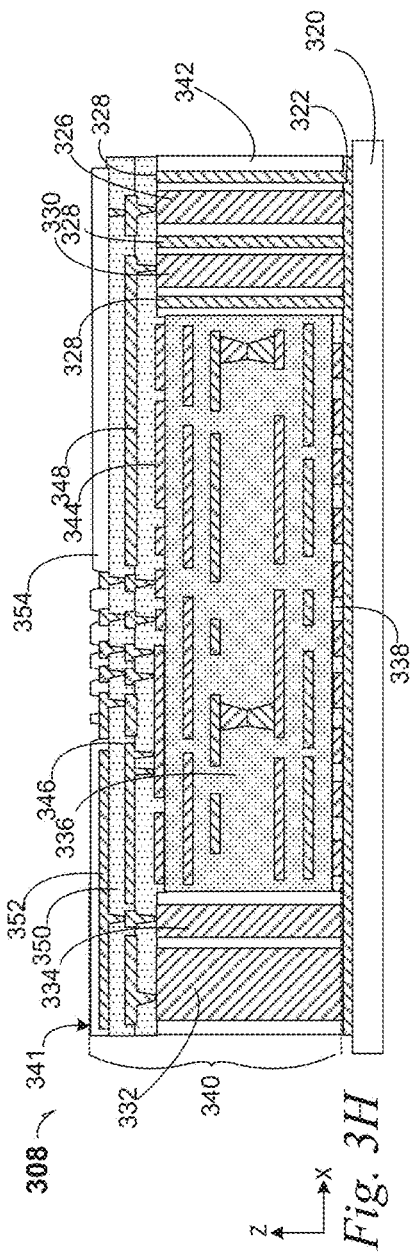
Figure 3I:
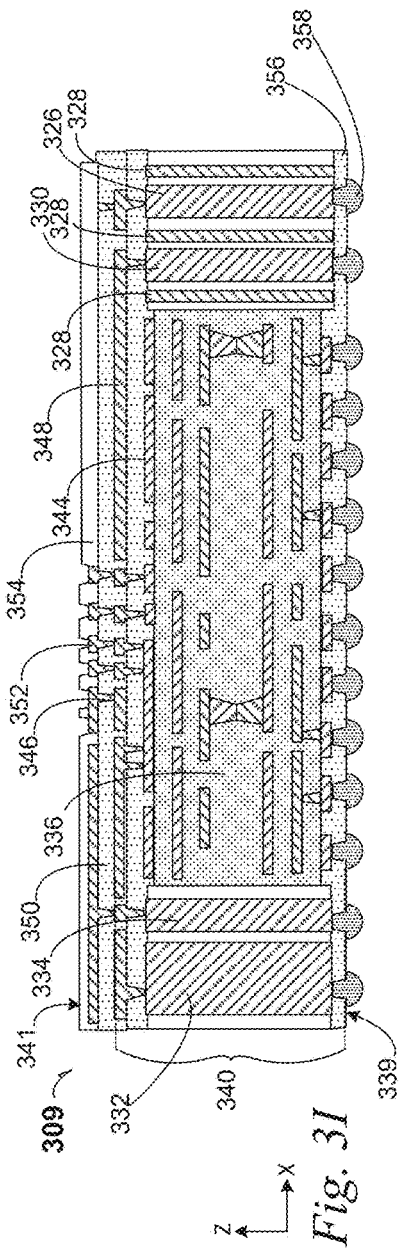

FIG. 3H is a cross-section elevation of the assembly 307 depicted in FIG. 3F after further processing according to an embodiment. The assembly 308 has been processed by depositing and patterning a subsequent build-up film 350, followed by plating a subsequent metallization 352, and lastly by depositing, patterning and curing an upper solder-resist film 354, which leaves solder-resist opens (SROs) at an integrated-circuit package substrate upper surface 341, to accept a flip-chip integrated-circuit die. In an embodiment, a third build-up film and traces and vias (not illustrated) is patterned and deposited, before formation of the subsequent build-up film 350 and 352, respectively. In an embodiment, the several build-up films and metallization, has four layers, to make a 4-layer RDL.

FIG. 3K is a cross-section elevation of the assembly 308 depicted in FIG. 3H after further processing according to an embodiment. Items 3I and 3J are omitted. The assembly 309 has been processed by removing the carrier 320 (see FIG. 3H), stripping the metallic film 322, and also stripping the bottom sacrificial protective layer 338.

After further processing, a land-side solder-resist film 356 is deposited, patterned and cured. Thereafter, a land-side electrical bump array is filled into the patterning of the solder-resist film 356, one electrical bump of which is indicted by reference number 358.

FIG. 3' is a cross-sectional elevation of an integrated-circuit package 300' similar to the IC package 300 depicted in FIG. 3, and from a different Y-longitudinal cross section according to several embodiments. Whereas unshielded power and ground frame interconnect vias 332 and 334 are seen in FIG. 3, at image left in FIG. 3', a shielded power frame interconnect 330' and a shielded I/O frame interconnect 326' are depicted at image left, opposite shielded power and I/O frame interconnects 330 and 236, respectively, at image right. Further two die-side decoupling capacitors 356 and 357 are depicted near the IC die 10.

In an embodiment, the several frame interconnects are assembled in close-packed configuration, where any three touching frame interconnects, that include one, each touch a third frame interconnect.

FIG. 4 is a cross-section elevation of an integrated-circuit package 400 according to an embodiment. Structures similar to structures and devices depicted in FIGS. 3 and 3', bear similar reference numbers.

Additionally in an embodiment a package substrate precursor 436 is inserted between two frame interconnects 430 and 432, which, although the frame interconnects 430 and 432 begin at a land side 439 of an IC package substrate 440, to not extend to a top redistribution layer 462, but to an insert redistribution layer 463. A shielded power frame interconnect 430 is at least partially shielded by a ground (Vss) frame interconnect 428, and an unshielded power frame interconnect 432 is located adjacent the package substrate precursor 436 opposite the shielded power frame interconnect 430. By locating intermediate-height power frame interconnects 432, or 432 latitudinally closer to the IC die, shunting power to the IC die, has a shorter path than from e.g., the shielded power frame interconnect 430.

Figure 5:
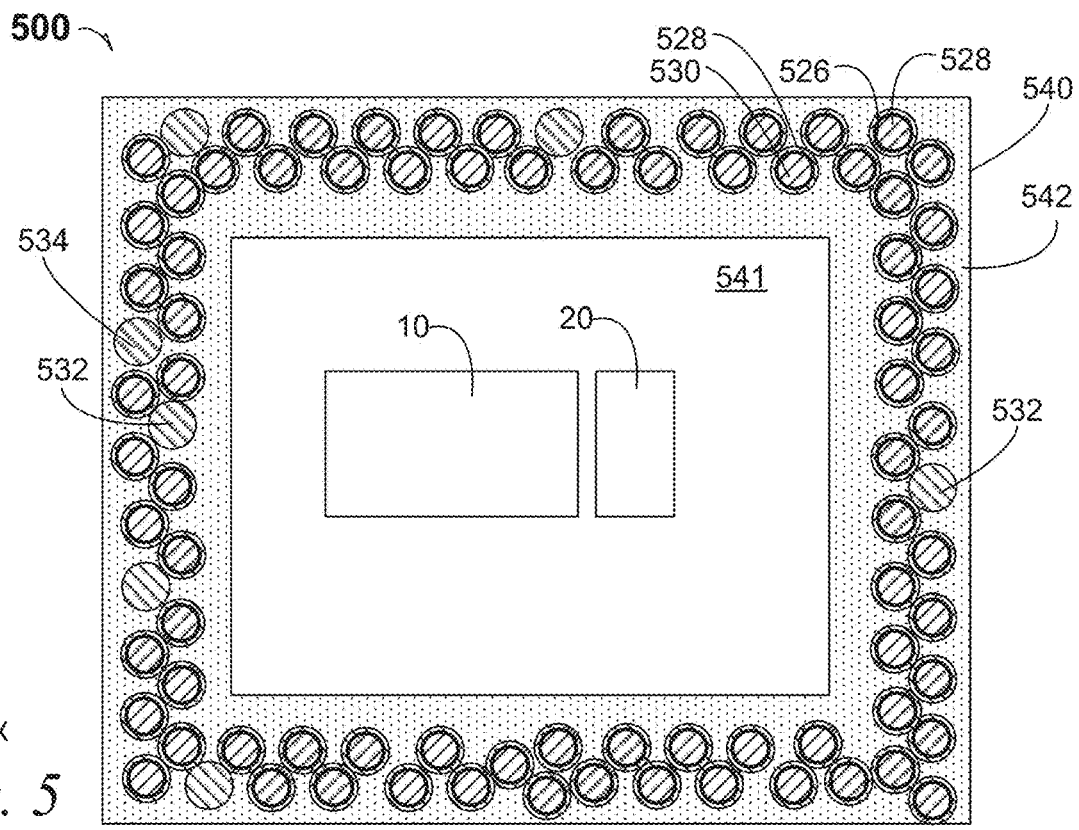
FIG. 5 is a top plan of an organic mold interconnect integrated-circuit package according to several embodiments.

FIG. 5 is a top plan of an organic mold interconnect integrated-circuit package 500 according to several embodiments. As illustrated, the several frame interconnects may be assembled in close-packed configuration, where any three touching frame interconnects one of which is an intermediate-height frame interconnect, each touch two adjacent frame interconnects. In an embodiment, the assembled frame interconnects are in stagger-packed configuration, where at least one frame interconnect is an intermediate-height frame interconnect.

A die side 541 of a package substrate 540 supports a first IC die 10 and a subsequent IC die 20 according to an embodiment. Several frame interconnects, form a frame form factor within an organic molding mass 542. In an embodiment, a shielded I/O interconnect 526 forms an annulus structure with a Vss shield 528. The organic molding mass 542 (depicted in heavy line) is also found in the interstices between the I/O frame interconnect 526 and the Vss shield interconnect 528, as well as between adjacent frame interconnects. In an embodiment, the organic molding mass 542 is also found in the interstices between the power frame interconnect 530 and the Vss shield interconnects 528. Additionally in an embodiment, an unshielded power frame interconnect 532 is within the frame-forming organic molding mass 542. Similarly and additionally in an embodiment, an unshielded ground frame interconnect 534 is within the frame forming organic molding mass 542.

In an embodiment, the first and subsequent IC dice 10 and 20 are part of a chipset for a computing system. In an embodiment, the first IC die 10 is a logic processor such as is made by Intel Corporation of Santa Clara, Calif. In an embodiment, the subsequent IC die 20 is a non-volatile memory die.

Figure 6:
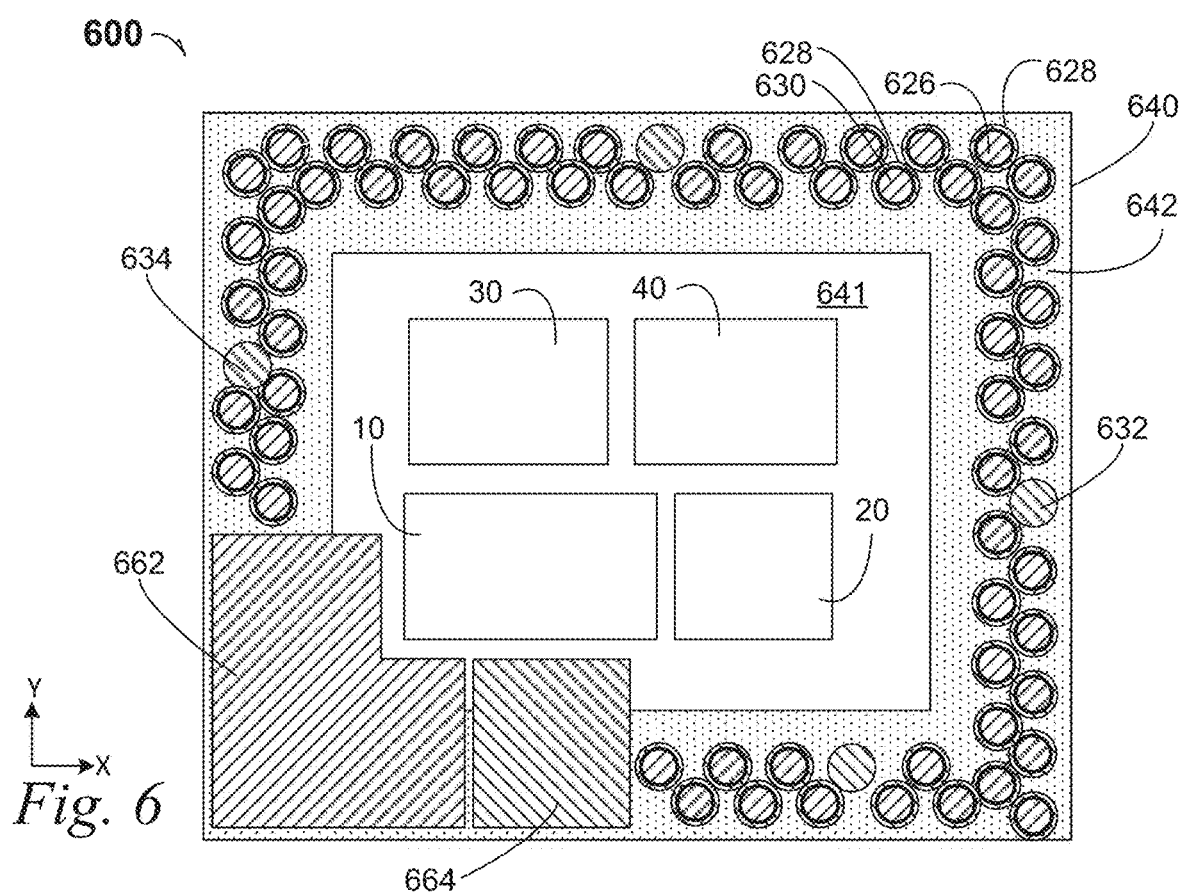
FIG. 6 is a top plan of an organic mold interconnect integrated-circuit package with a merged power frame interconnect according to several embodiments.

FIG. 6 is a top plan of an organic mold interconnect integrated-circuit package 600 with a merged power frame interconnect according to several embodiments.

A die side 641 of a package substrate 540 supports a first IC die 10, a subsequent IC die 20, a third IC die 30 and a fourth IC die 40 according to an embodiment. Several frame interconnects, form a frame form factor within an organic molding mass 642.

In an embodiment, a merged power frame interconnect 662 provides power (Vcc) to at a proximate IC die such as a processor IC first die 10. In an embodiment, a merged ground (Vss) frame interconnect 664 provides a relatively large source collection structure for active devices on the die side 641.

In an embodiment and in addition to at least one of the merged power frame interconnect 662 and the merged ground frame interconnect 664, a shielded I/O interconnect 626 forms an annulus structure with a Vss shield 628. The organic molding mass 642 (depicted in heavy line) is also found in the interstices between the I/O frame interconnect 626 and the Vss shield interconnect 628, as well as between adjacent frame interconnects. In an embodiment, the organic molding mass 642 is also found in the interstices between the power frame interconnect 630 and the Vss shield interconnects 628. Additionally in an embodiment, an unshielded power frame interconnect 632 is within the frame-forming organic molding mass 642. Similarly and additionally in an embodiment, an unshielded ground frame interconnect 634 is within the frame forming organic molding mass 642.

In an embodiment, the first and subsequent IC dice 10 and 20 are part of a chipset for a computing system. In an embodiment, the first IC die 10 is a logic processor such as is made by Intel Corporation of Santa Clara, Calif. In an embodiment, the subsequent IC die 20 is a non-volatile memory die stack including at least one through-silicon via between IC memory dice. In an embodiment, the third IC die 30 is a platform-controller hub IC die 30. In an embodiment, the fourth IC die 40 is a baseband processor die 40.

Figure 7:
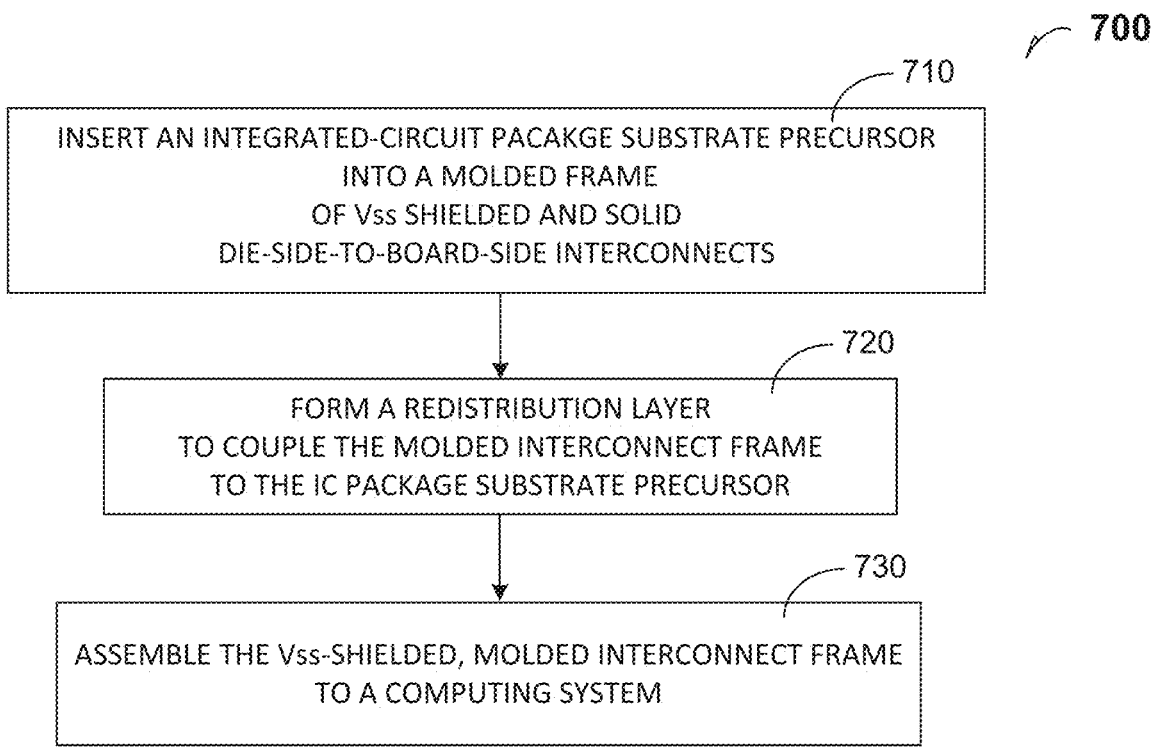
FIG. 7 is a process flow diagram according to several embodiments.

FIG. 7 is a process flow diagram 700 according to several embodiments.

At 710, the process includes inserting an IC package substrate precursor into a molded frame of shielded I/O and Vcc frame interconnects and unshielded Vcc and Vss frame interconnects. In an embodiment, some of the frame interconnects have an intermediate Z-height.

At 720, the process includes forming a redistribution layer to couple the molded interconnect frame to the IC package substrate precursor. In an embodiment, an insert RDL is first formed on intermediate Z-height frame interconnects, followed by a top RDL that includes a die side of the IC package substrate.

At 730, the process includes assembling the shielded and unshielded frame interconnects, the IC package substrate to a computing system. In an embodiment, the computing system includes at least part of a chipset on the IC package die side.

Figure 8:
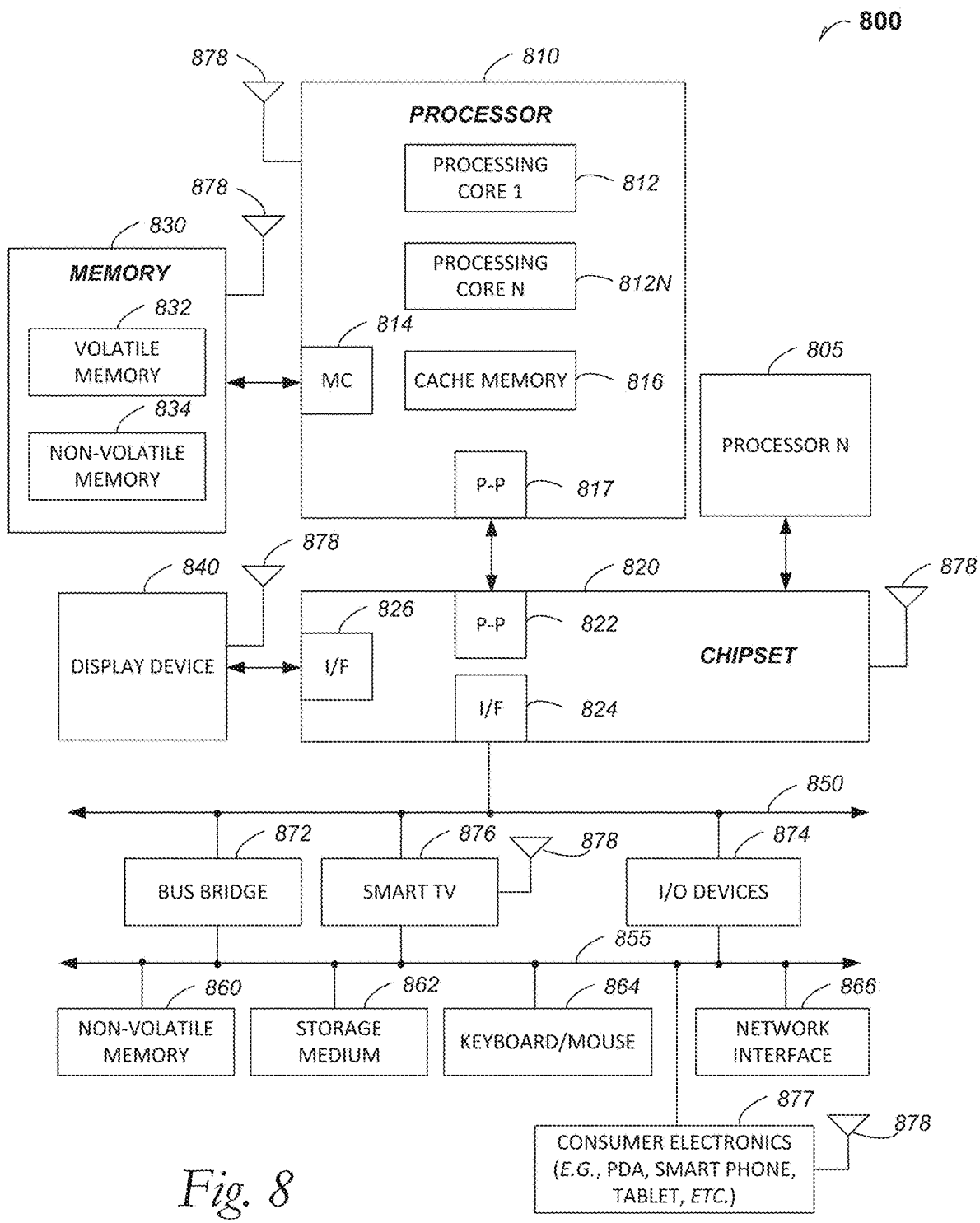
FIG. 8 is included to show an example of a higher-level device application for the disclosed embodiments.

FIG. 8 is included to show an example of a higher-level device application for the disclosed embodiments. The molded frame-interconnect integrated-circuit package embodiments may be found in several parts of a computing system. In an embodiment, the molded interconnects bridge embodiments can be part of a communications apparatus such as is affixed to a cellular communications tower. In an embodiment, a computing system 800 includes, but is not limited to, a desktop computer. In an embodiment, a computing system 800 includes, but is not limited to a laptop computer. In an embodiment, a computing system 800 includes, but is not limited to a tablet. In an embodiment, a computing system 800 includes, but is not limited to a notebook computer. In an embodiment, a computing system 800 includes, but is not limited to a personal digital assistant (PDA). In an embodiment, a computing system 800 includes, but is not limited to a server. In an embodiment, a computing system 800 includes, but is not limited to a workstation. In an embodiment, a computing system 800 includes, but is not limited to a cellular telephone. In an embodiment, a computing system 800 includes, but is not limited to a mobile computing device. In an embodiment, a computing system 800 includes, but is not limited to a smart phone. In an embodiment, a system 800 includes, but is not limited to an internet appliance. Other types of computing devices may be configured with the microelectronic device that includes molded frame-interconnect integrated-circuit package embodiments.

In an embodiment, the processor 810 has one or more processing cores 812 and 812N, where 812N represents the Nth processor core inside processor 810 where N is a positive integer. In an embodiment, the electronic device system 800 using a molded frame-interconnect integrated-circuit package embodiment that includes multiple processors including 810 and 805, where the processor 805 has logic similar or identical to the logic of the processor 810. In an embodiment, the processing core 812 includes, but is not limited to, pre-fetch logic to fetch instructions, decode logic to decode the instructions, execution logic to execute instructions and the like. In an embodiment, the processor 810 has a cache memory 816 to cache at least one of instructions and data for the molded frame-interconnect integrated-circuit package element on an integrated-circuit package substrate in the system 800. The cache memory 816 may be organized into a hierarchal structure including one or more levels of cache memory.

In an embodiment, the processor 810 includes a memory controller 814, which is operable to perform functions that enable the processor 810 to access and communicate with memory 830 that includes at least one of a volatile memory 832 and a non-volatile memory 834. In an embodiment, the processor 810 is coupled with memory 830 and chipset 820. In an embodiment, the chipset 820 is part of a molded frame-interconnect integrated-circuit package embodiment depicted, e.g. in FIGS. 3, 3', 4, 5 and 6.

The processor 810 may also be coupled to a wireless antenna 878 to communicate with any device configured to at least one of transmit and receive wireless signals. In an embodiment, the wireless antenna interface 878 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 832 includes, but is not limited to. Synchronous Dynamic Random-Access Memory (SDRAM), Dynamic Random-Access Memory (DRAM), RAMBUS Dynamic Random-Access Memory (RDRAM), and/or any other type of random access memory device. The non-volatile memory 834 includes, but is not limited to, flash memory, phase change memory (PCM), read-only memory (ROM), electrically erasable programmable read-only memory (EEPROM), or any other type of non-volatile memory device.

The memory 830 stores information and instructions to be executed by the processor 810. In an embodiment, the memory 830 may also store temporary variables or other intermediate information while the processor 810 is executing instructions. In the illustrated embodiment, the chipset 820 connects with processor 810 via Point-to-Point (PtP or P-P) interfaces 817 and 822. Either of these PtP embodiments may be achieved using a molded frame-interconnect integrated-circuit package embodiment as set forth in this disclosure. The chipset 820 enables the processor 810 to connect to other elements in a molded frame-interconnect integrated-circuit package embodiment in a system 800. In an embodiment, interfaces 817 and 822 operate in accordance with a PtP communication protocol such as the Intel® QuickPath Interconnect (QPI) or the like. In other embodiments, a different interconnect may be used.

In an embodiment, the chipset 820 is operable to communicate with the processor 810, 805N, the display device 840, and other devices 872, 876, 874, 860, 862, 864, 866, 877, etc. The chipset 820 may also be coupled to a wireless antenna 878 to communicate with any device configured to at least do one of transmit and receive wireless signals.

The chipset 820 connects to the display device 840 via the interface 826. The display 840 may be, for example, a liquid crystal display (LCD), a plasma display, cathode ray tube (CRT) display, or any other form of visual display device. In an embodiment, the processor 810 and the chipset 820 are merged into a molded frame-interconnect integrated-circuit package embodiment in a system. Additionally, the chipset 820 connects to one or more buses 850 and 855 that interconnect various elements 874, 860, 862, 864, and 866. Buses 850 and 855 may be interconnected together via a bus bridge 872 such as at least one molded frame-interconnect integrated-circuit package embodiment. In an embodiment, the chipset 820, via interface 824, couples with a non-volatile memory 860, a mass storage device(s) 862, a keyboard/mouse 864, a network interface 866, smart TV 876, and the consumer electronics 877, etc.

In an embodiment, the mass storage device 862 includes, but is not limited to, a solid-state drive, a hard disk drive, a universal serial bus flash memory drive, or any other form of computer data storage medium. In one embodiment, the network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the molded frame-interconnect integrated-circuit package embodiments in a computing system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into the processor core 812.

To illustrate the molded frame-interconnect integrated-circuit package IC package embodiments and methods disclosed herein, a non-limiting list of examples is provided herein:

Example 1 is an integrated-circuit package assembly, comprising: an integrated-circuit (IC) package substrate, including a die side and a land side; an interconnect frame surrounding the integrated-circuit package substrate, the interconnect frame including: an input/output interconnect that extends at least the height of the IC package land side to a redistribution layer near the IC package die side, wherein the input/output interconnect is shielded by a ground (Vss) annulus; a power interconnect that extends at least the height of the IC package land side to the redistribution layer near the IC package die side, wherein the power interconnect is shielded by a ground (Vss) annulus; the redistribution layer, wherein the redistribution layer is coupled to each of the IC package substrate, the input/output interconnect and the power interconnect, wherein the build-up layer includes a footprint array for an integrated-circuit die.

In Example 2, the subject matter of Example 1 optionally includes an integrated-circuit die on the footprint array.

In Example 3, the subject matter of any one or more of Examples 1-2 optionally include a power plane below a solder-resist layer at the package die side, wherein the power plane is coupled to a shielded Vcc frame interconnect.

In Example 4, the subject matter of any one or more of Examples 1-3 optionally include a power plane below a solder-resist layer at the package die side, wherein the power plane is coupled to an unshielded Vcc frame interconnect.

In Example 5, the subject matter of any one or more of Examples 1-4 optionally include a ground plane below a solder-resist layer at the package die side, wherein the ground plane is coupled to a shielding Vss frame interconnect, and wherein the shielding Vss frame interconnect, surrounds one of a shielded power frame interconnect and a shielded input/output frame interconnect.

In Example 6, the subject matter of any one or more of Examples 1-5 optionally include a ground plane below a solder-resist layer at the package die side, wherein the ground plane is coupled to an unshielded Vss frame interconnect.

In Example 7, the subject matter of any one or more of Examples 1-6 optionally include a power plane below a solder-resist layer at the package die side, wherein the power plane is coupled to a shielded Vcc frame interconnect; and a ground plane below a solder-resist layer at the package die side, wherein the ground plane is coupled to a shielding Vss frame interconnect, and wherein the shielding Vss frame interconnect, surrounds one of a shielded power frame interconnect and a shielded input/output frame interconnect.

In Example 8, the subject matter of any one or more of Examples 1-7 optionally include wherein the interconnect frame further includes an unshielded power interconnect that extends at least the height of the IC package land side to the redistribution layer.

In Example 9, the subject matter of any one or more of Examples 1-8 optionally include wherein the interconnect frame further includes: an unshielded power interconnect that extends at least the height of the IC package land side to the redistribution layer.

In Example 10, the subject matter of any one or more of Examples 1-9 optionally include wherein the interconnect frame further includes: an unshielded source (Vss) interconnect adjacent and the unshielded power (Vcc) interconnect, wherein the unshielded source (Vss) interconnect that extends at least the height of the IC package land side to the redistribution layer; and a dielectric film that contacts unshielded source interconnect.

In Example 11, the subject matter of any one or more of Examples 1-10 optionally include wherein the interconnect frame further includes: an unshielded power interconnect that extends at least the height of the IC package land side to the redistribution layer; an unshielded source (Vss) interconnect adjacent and the unshielded power (Vcc) interconnect, wherein the unshielded source (Vss) interconnect that extends at least the height of the IC package land side to the redistribution layer; and a dielectric film that contacts unshielded power interconnect and the unshielded source interconnect.

In Example 12, the subject matter of any one or more of Examples 1-11 optionally include wherein the interconnect frame has a configuration selected from a stagger-packed contiguous double row of interconnects, and a close-packed double row of interconnects.

In Example 13, the subject matter of any one or more of Examples 1-12 optionally include wherein the interconnect frame has a configuration selected from a stagger-packed contiguous triple row of interconnects, and a close-packed triple row of interconnects.

Example 14 is an integrated-circuit package assembly, comprising: an integrated-circuit (IC) package substrate, including a die side and a land side; an interconnect frame surrounding the integrated-circuit package substrate, the interconnect frame including: an input/output interconnect that extends at least the height of the IC package land side to a redistribution layer near the IC package die side, wherein the input/output interconnect is shielded by a ground (Vss) annulus; a power interconnect that extends at least the height of the IC package land side to the redistribution layer near the IC package die side, wherein the power interconnect is shielded by a ground (Vss) annulus; an intermediate-height frame interconnect that extends from the IC package land side to an insert redistribution layer; and the redistribution layer, wherein the redistribution layer is coupled to the insert redistribution layer, and to each of the IC package substrate, the input/output interconnect and the power interconnect, wherein the build-up layer includes a footprint array for an integrated-circuit die.

In Example 15, the subject matter of Example 14 optionally includes an integrated-circuit die on the footprint array.

In Example 16, the subject matter of any one or more of Examples 14-15 optionally include a power plane below a solder-resist layer at the package die side, wherein the power plane is coupled to a shielded Vcc frame interconnect.

In Example 17, the subject matter of any one or more of Examples 14-16 optionally include a power plane below a solder-resist layer at the package die side, wherein the power plane is coupled to an unshielded Vcc frame interconnect.

In Example 18, the subject matter of any one or more of Examples 14-17 optionally include a ground plane below a solder-resist layer at the package die side, wherein the ground plane is coupled to a shielding Vss frame interconnect, and wherein the shielding Vss frame interconnect, surrounds one of a shielded power frame interconnect and a shielded input/output frame interconnect.

In Example 19, the subject matter of any one or more of Examples 14-18 optionally include a ground plane below a solder-resist layer at the package die side, wherein the ground plane is coupled to an unshielded Vss frame interconnect.

In Example 20, the subject matter of any one or more of Examples 14-19 optionally include a power plane below a solder-resist layer at the package die side, wherein the power plane is coupled to a shielded Vcc frame interconnect; and a ground plane below a solder-resist layer at the package die side, wherein the ground plane is coupled to a shielding Vss frame interconnect, and wherein the shielding Vss frame interconnect, surrounds one of a shielded power frame interconnect and a shielded input/output frame interconnect.

Example 21 is a computing system comprising: an integrated-circuit die on a die side of an integrated-circuit package substrate; an interconnect frame surrounding the integrated-circuit package substrate, the interconnect frame including: an input/output interconnect that extends at least the height of the IC package land side to a redistribution layer near the IC package die side, wherein the input/output interconnect is shielded by a ground (Vss) annulus; a power interconnect that extends at least the height of the IC package land side to the redistribution layer near the IC package die side, wherein the power interconnect is shielded by a ground (Vss) annulus; the redistribution layer, wherein the redistribution layer is coupled to each of the IC package substrate, the input/output interconnect and the power interconnect, wherein the build-up layer includes a footprint array for an integrated-circuit die; wherein the IC package substrate is coupled to a printed wiring board at the land side; and wherein the IC die is part of a chipset.

In Example 22, the subject matter of Example 21 optionally includes a subsequent IC die on the die side, a third IC die on the die side, and a fourth IC die on the die side; wherein the IC die is a first IC processor die, the subsequent IC die is a memory die, the third IC die is one of a memory controller hub and a platform controller hub, and the fourth IC die is a baseband processor.

In Example 23, the subject matter of any one or more of Examples 21-22 optionally include wherein the printed wiring board includes an external shell that is a dielectric material, and wherein the external shell is at least part of the exterior of an apparatus selected from a mobile computing system and a drone.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. An integrated-circuit package assembly, comprising:
an integrated-circuit (IC) package substrate, including a die side and a land side;
a plurality of interconnects located at a periphery of the package substrate, including:
an input/output interconnect that extends at least the height of the IC package land side to a redistribution layer near the IC package die side, wherein the input/output interconnect is shielded by a ground (Vss) annulus;
a power interconnect that extends at least the height of the IC package land side to the redistribution layer near the IC package die side, wherein the power interconnect is shielded by a ground (Vss) annulus;
wherein the redistribution layer is coupled to each of the IC package substrate, the input/output interconnect and the power interconnect.

2. The integrated-circuit package assembly of claim 1, further including an integrated-circuit die on the redistribution layer.

3. The integrated-circuit package assembly of claim 1, further including a power plane below a solder-resist layer at the package die side, wherein the power plane is coupled to at least one of the plurality of interconnects.

4. The integrated-circuit package assembly of claim 1, further including a power plane below a solder-resist layer at the package die side, wherein the power plane is coupled to an unshielded Vcc frame interconnect.

5. The integrated-circuit package assembly of claim 1, further including a ground plane below a solder-resist layer at the package die side, wherein the ground plane is coupled to a ground (Vss) annulus.

6. The integrated-circuit package assembly of claim 1, further including a ground plane below a solder-resist layer at the package die side, wherein the ground plane is coupled to an unshielded interconnect.

7. The integrated-circuit package assembly of claim 1, wherein the plurality of interconnects further includes an unshielded power interconnect that extends at least the height of the IC package land side to the redistribution layer.

8. The integrated-circuit package assembly of claim 1, wherein the plurality of interconnects includes a double row of interconnects that continues around a perimeter of the package substrate.

9. An integrated-circuit package assembly, comprising:
an integrated-circuit (IC) package substrate, including a die side and a land side;
a plurality of interconnects located at a periphery of the package substrate, including:
an input/output interconnect that extends at least the height of the IC package land side to a redistribution layer near the IC package die side, wherein the input/output interconnect is shielded by a ground (Vss) annulus;
a power interconnect that extends at least the height of the IC package land side to the redistribution layer near the IC package die side, wherein the power interconnect is shielded by a ground (Vss) annulus;
an intermediate-height interconnect that extends from the IC package land side to an insert redistribution layer; and
the redistribution layer, wherein the redistribution layer is coupled to the insert redistribution layer, and to each of the IC package substrate, the input/output interconnect and the power interconnect.

10. The integrated-circuit package assembly of claim 9, further including an integrated-circuit die on the redistribution layer.

11. The integrated-circuit package assembly of claim 9, further including a power plane below a solder-resist layer at the package die side, wherein the power plane is coupled to a shielded Vcc frame interconnect.

12. The integrated-circuit package assembly of claim 9, further including a power plane below a solder-resist layer at the package die side, wherein the power plane is coupled to an unshielded Vcc frame interconnect.

13. The integrated-circuit package assembly of claim 9, further including a ground plane below a solder-resist layer at the package die side, wherein the ground plane is coupled to a ground (Vss) annulus.

14. The integrated-circuit package assembly of claim 9, further including a ground plane below a solder-resist layer at the package die side, wherein the ground plane is coupled to an unshielded Vss frame interconnect.

15. A computing system comprising:
an integrated-circuit die on a die side of an integrated-circuit package substrate;
a plurality of interconnects located at a periphery of the package substrate, including:
an input/output interconnect that extends at least the height of the IC package land side to a redistribution layer near the IC package die side, wherein the input/output interconnect is shielded by a ground (Vss) annulus;
a power interconnect that extends at least the height of the IC package land side to the redistribution layer near the IC package die side, wherein the power interconnect is shielded by a ground (Vss) annulus;
wherein the redistribution layer is coupled to each of the IC package substrate, the input/output interconnect and the power interconnect;
wherein the IC package substrate is coupled to a printed wiring board at the land side; and
wherein the IC die is part of a chipset.

16. The computing system of claim 15, further including a subsequent IC die on the die side, a third IC die on the die side, and a fourth IC die on the die side;
wherein the IC die is a first IC processor die, the subsequent IC die is a memory die, the third IC die is one of a memory controller hub and a platform controller hub, and the fourth IC die is a baseband processor.

\* \* \* \* \*